United States Patent
Bailey

Patent Number: 5,985,713
Date of Patent: Nov. 16, 1999

[54] METHOD OF FORMING IRIDIUM OXIDE LOCAL INTERCONNECT

[75] Inventor: Richard A. Bailey, Woodland Park, Colo.

[73] Assignee: Ramtron International Corporation, Colorado Springs, Colo.

[21] Appl. No.: 09/183,545

[22] Filed: Oct. 29, 1998

Related U.S. Application Data

[62] Division of application No. 08/618,884, Mar. 20, 1996, Pat. No. 5,838,605.

[51] Int. Cl.$^6$ .......................... H01L 29/76; G11C 11/22; G11C 11/24
[52] U.S. Cl. .......................... 438/241; 438/3; 438/393; 438/250; 438/258; 438/685; 438/643; 438/653; 257/295; 257/763; 257/768; 257/769; 365/145; 365/149
[58] Field of Search .......................... 438/3, 393, 239, 438/241, 242, 250, 258, 653, 685, 643; 257/295, 763, 768, 769; 365/145, 149

[56] References Cited

U.S. PATENT DOCUMENTS

| | | | |
|---|---|---|---|
| 4,982,309 | 1/1991 | Shepherd | 361/321.3 |
| 5,003,428 | 3/1991 | Shepherd | 361/322 |
| 5,053,917 | 10/1991 | Miyasaka et al. | 361/321.5 |
| 5,122,923 | 6/1992 | Matsubara et al. | 361/321.5 |
| 5,191,510 | 3/1993 | Huffman | 361/313 |
| 5,216,572 | 6/1993 | Larson | 361/313 |
| 5,236,550 | 8/1993 | Abt et al. | 216/67 |
| 5,369,296 | 11/1994 | Kato | 257/295 |
| 5,471,364 | 11/1995 | Summerfelt | 361/321.4 |
| 5,475,248 | 12/1995 | Takenaka | 257/295 |
| 5,491,102 | 2/1996 | Desu et al. | 438/3 |
| 5,554,866 | 9/1996 | Nishioka | 257/295 |

*Primary Examiner*—John F. Niebling
*Assistant Examiner*—Ha Tran Nguyen
*Attorney, Agent, or Firm*—Peter J. Meza, Esq.

[57] ABSTRACT

An iridium oxide local interconnect method for a ferroelectric memory cell includes the steps of forming a conductive layer that extends from a source/drain contact of the transistor proximate to an electrode contact of the ferroelectric capacitor and forming an iridium oxide local interconnect extending from the source/drain contact of the transistor to the electrode contact of the ferroelectric capacitor. The conductive layer is laterally terminated not less than one-half micron from the electrode contact of the ferroelectric capacitor. The conductive layer can include an upper iridium layer and a bottom titanium nitride layer, or can include a single layer of completely reacted titanium nitride. After the local interconnect is formed a top oxide layer is deposited. A late recovery anneal is then performed in oxygen at an elevated temperature to rejuvenate the electrical characteristics of the ferroelectric capacitor. Finally, a bit line contact is opened and metalized.

12 Claims, 4 Drawing Sheets

METHOD OF FORMING IRIDIUM OXIDE LOCAL INTERCONNECT

The present application is a divisional application of co-pending U.S. patent application Ser. No. 08/618,884 filed Mar. 20, 1996, to issue November 17 as U.S. Pat. No. 5,838,605, which is incorporated in its entirety herein.

BACKGROUND OF THE INVENTION

This invention relates generally to ferroelectric memory cells. More particularly, the present invention relates to an iridium oxide local interconnect method and a corresponding ferroelectric memory cell.

A one-transistor, one-capacitor ("1T-1C") ferroelectric memory cell 10 is shown in schematic form in FIG. 1. Memory cell 10 is a three-terminal device having a bit line node 12 and a word line node 14, in similar fashion to a DRAM cell, but in addition, having a plate line node 16 for poling a ferroelectric capacitor 20. Memory cell 10 includes an MOS transistor 18, the gate forming the word line node 14, and a source/drain forming the bit line node 12. One electrode of ferroelectric capacitor 20 is coupled to the other source/drain of transistor 18 at intermediate node 19, and the other electrode of ferroelectric capacitor 20 forms the plate line node 16. Memory cell 10 is typically included in an array of such cells, not shown in FIG. 1, arranged in rows and columns.

In the prior art, a "local interconnect" or short metal strap is used to physically form the intermediate node 19 in an integrated circuit implementation of memory cell 10. A common material used in such a local interconnect is titanium nitride ("TiN") because of its low resistivity and ability to interface with both silicon and platinum. One problem with titanium nitride is that this material can cause water molecules found in oxide layers to dissociate into hydrogen and oxygen ions. Oxide layers are commonly used in the fabrication of integrated circuit ferroelectric memory cells, therefore hydrogen can come into contact with the dielectric layer of the ferroelectric capacitor 20 as a result of water or hydroxyl ion dissociation. It is well known that hydrogen can cause the electrical performance of ferroelectric materials to degrade, by reducing or entirely eliminating the switched charge necessary for discerning a valid data state. The production of hydrogen and consequent degradation undesirably increases at elevated annealing or packaging temperatures above 400° C.

Iridium oxide is known as an electrode material in the prior art, but it does not form a reliable ohmic contact directly with silicon. Iridium oxide is therefore not recommended as the sole local interconnect material.

What is desired, therefore, is a method for forming a low resistivity local interconnect for a ferroelectric memory cell that will not degrade the performance of the ferroelectric dielectric layer, even at elevated temperatures above 400° C.

SUMMARY OF THE INVENTION

It is, therefore, a principal object of the present invention to create a local interconnect for a ferroelectric memory cell that will not degrade switching performance.

It is another object of the invention to maintain a low resistivity local interconnect.

It is another object of the invention to provide a local interconnect for a ferroelectric memory that is compatible with both ferroelectric and CMOS semiconductor integrated circuit fabrication methods.

It is an advantage of the invention that rejuvenating anneals at temperatures above 400° C. can be performed at the end of the integrated circuit process flow without causing any switching degradation to the ferroelectric memory cells.

It is another advantage of the invention that ferroelectric memories fabricated according to the method of the present invention can be packaged in ceramic ("CERDIP") packages that are subjected to elevated temperatures without causing any switching degradation to the ferroelectric memory cells.

According to the present invention an iridium oxide local interconnect method for a ferroelectric memory cell includes the steps of forming a conductive layer that extends from a source/drain contact of the transistor proximate to an electrode contact of the ferroelectric capacitor and forming an iridium oxide local interconnect extending from the source/drain contact of the transistor to the electrode contact of the ferroelectric capacitor. The conductive layer is laterally terminated not less than one-half micron from the electrode contact of the ferroelectric capacitor. The conductive layer can include an upper iridium layer and a bottom titanium nitride layer, or can include a single layer of completely reacted titanium nitride. After the local interconnect is formed, a top oxide layer is deposited. A late recovery anneal is then performed in oxygen at an elevated temperature to rejuvenate the electrical characteristics of the ferroelectric capacitor. Finally, a bit line contact is opened and metalized.

The foregoing and other objects, features and advantages of the invention will become more readily apparent from the following detailed description of a preferred embodiment of the invention which proceeds with reference to the accompanying drawings.

DETAILED DESCRIPTION

The iridium oxide local interconnect method of the present invention is described with reference to sequentially presented FIGS. 2 through 10. While these drawing figures are highly useful in achieving an understanding of the present invention, they are not to scale, and the exact contours of oxide layers and other features may not exactly represent the actual physical contours of the fabricated integrated circuit.

Figure 1:
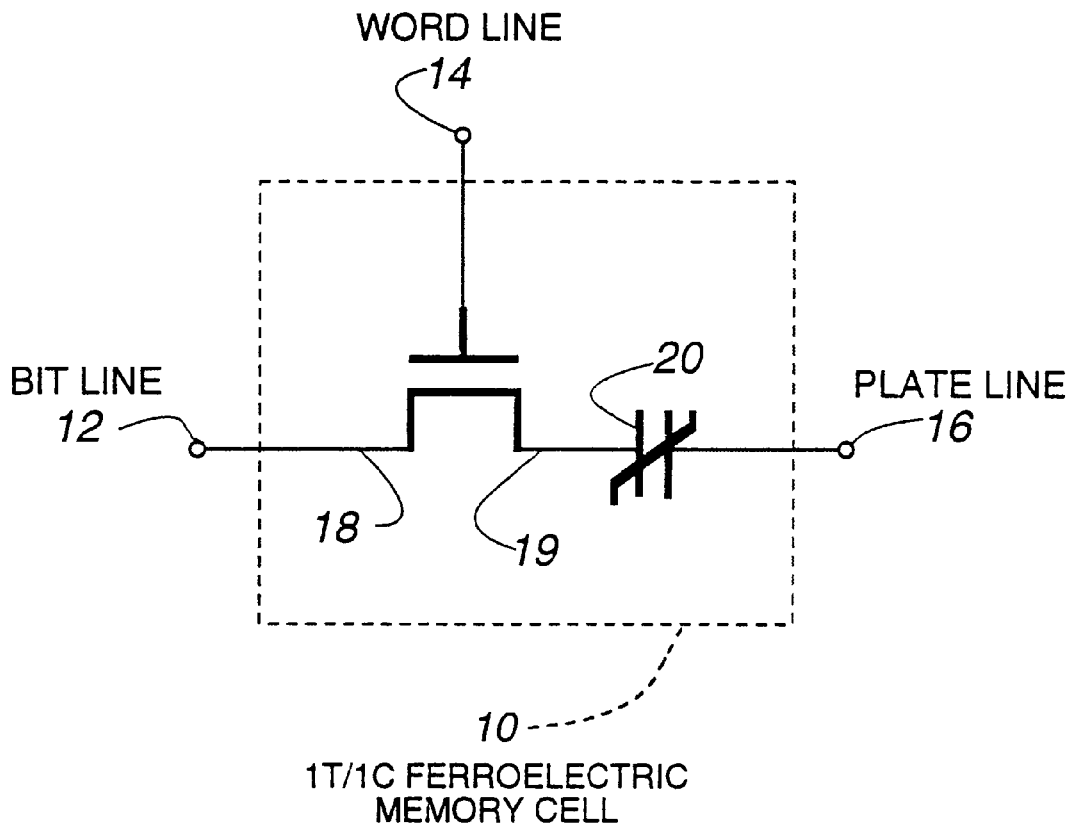
FIG. 1 a schematic diagram of a 1T-1C ferroelectric memory cell.
Figure 2:
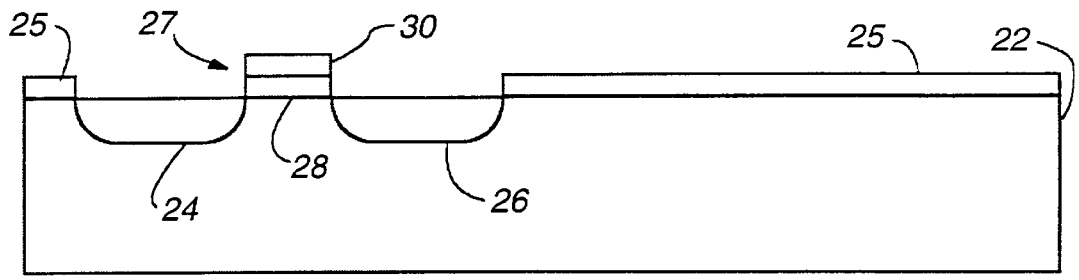
FIGS. 2–10 are sequential cross-sectional diagrams of an integrated circuit ferroelectric memory cell that illustrate the iridium oxide local interconnect method of the present invention.

Referring now to FIG. 2, an MOS transistor 27 is fabricated in a silicon or other semiconductor substrate 22 including field oxide layer 25, having a first source/drain region 24, a second source/drain region 26, a gate oxide layer 28, and a gate 30.

Figure 3:
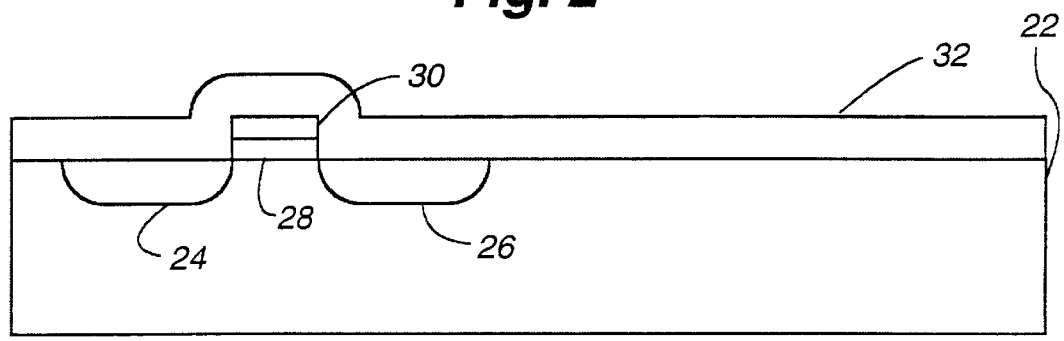

In FIG. 3, a first oxide layer 32 is deposited to a thickness of between about 5000 and 6000 Angstroms. Oxide layer 32 can be deposited using chemical vapor deposition ("CVD"). Oxide layer 32 is ideally reflowed boro-phospho-silicate glass ("BPSG").

Figure 4:
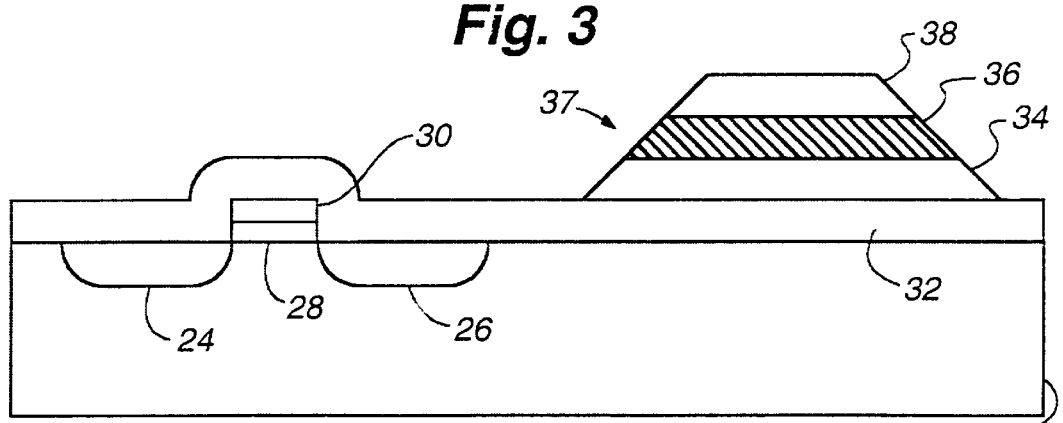

In FIG. 4, a ferroelectric capacitor stack 37 is fabricated in close proximity to transistor 27. Ferroelectric capacitor stack 37 includes a bottom electrode 34, a ferroelectric dielectric layer 36, and a top electrode 38. The bottom electrode 34 is typically a titanium adhesion layer about 200 Angstroms thick and a platinum layer about 1750 Angstroms thick. The ferroelectric dielectric layer 36 is typically either lead zirconate titanate ("PZT"), strontium bismuth tantalate ("SBT"), or other known ferroelectric materials, from about 1500 to 3000 Angstroms thick. The upper electrode is typically a platinum layer about 1750 Angstroms thick. Platinum and PZT can both be etched by reactive ion etching or ion milling, either sequentially or simultaneously.

Figure 5:
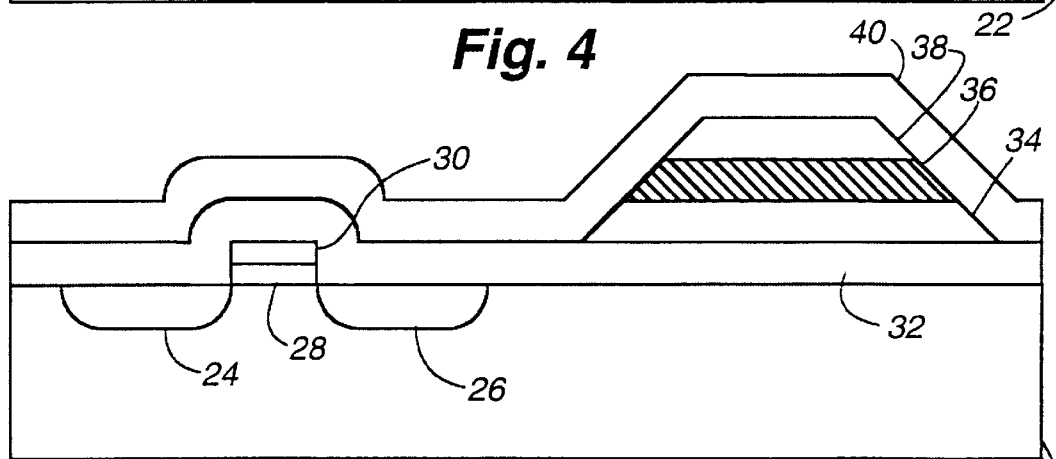

In FIG. 5, a second oxide layer 40 is deposited over the upper surface of the first oxide layer 32 and the ferroelectric capacitor 37. The second oxide layer 40 is preferably phosphorous-doped glass ("PSG") deposited to a thickness of between 2000 and 3000 Angstroms.

Figure 6:
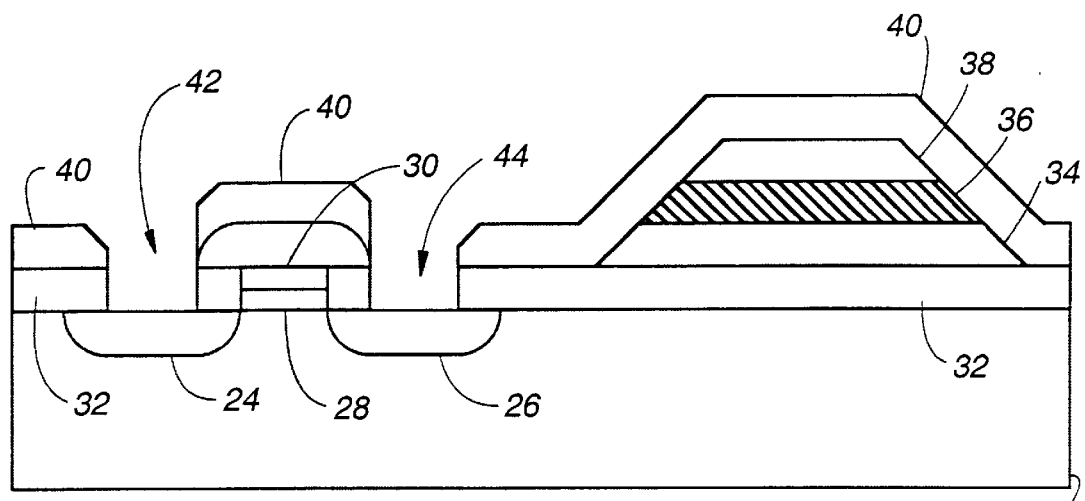

In FIG. 6, source/drain contacts 42 and 44 are opened through the first and second oxide layers 32 and 40 to the source/drain regions 24 and 26 of transistor 27. Source/drain contacts 42 and 44 are opened through a wet/dry etch that tapers the top of the contacts.

Figure 7:
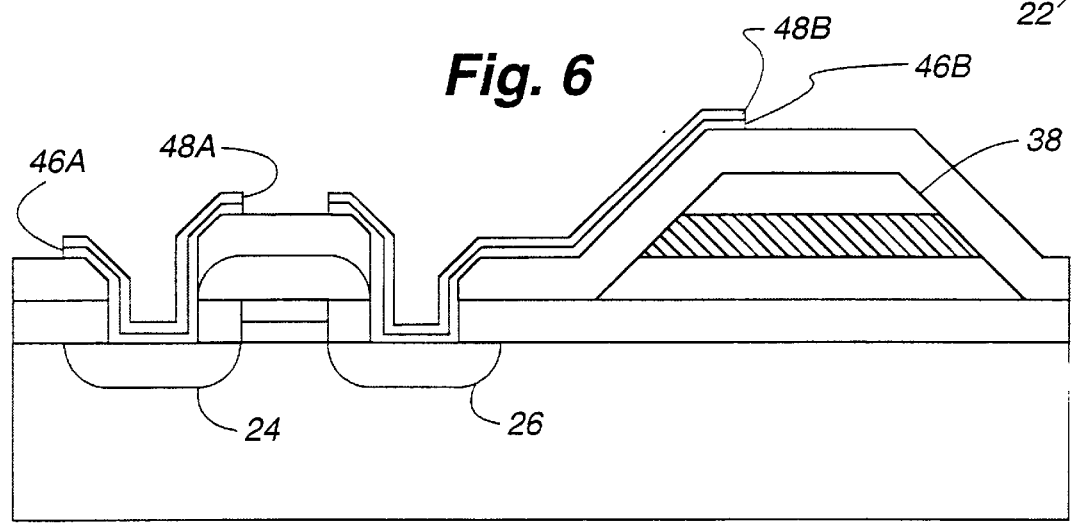

In FIG. 7, a conductive layer 46, 48 is deposited, patterned, and etched. A portion 46B, 48B extends from source/drain contact 44 of transistor 27 proximate to ferroelectric capacitor 37. Another portion 46A, 48A of the conductive layer also completely metalizes the other source/drain contact 42 for subsequent connection to bit line 12 (bit line 12 is not shown in FIG. 7). The conductive layer 46, 48 includes a titanium nitride bottom layer 46 deposited to a thickness of between 200 and 1500 Angstroms thick, with a preferred thickness of about 800 Angstroms. The conductive layer 46, 48 also includes an iridium top layer 48 deposited to a thickness of between 200 and 1500 Angstroms thick, with a preferred thickness of about 1200 Angstroms. The iridium top layer 48 is used primarily to prevent oxidation of the titanium nitride bottom layer 46. The conductive layer 46, 48 is patterned and etched into portions 46A and 46B, and 48A and 48B using a reactive ion etch or ion milling process.

Alternatively, the conductive layer 46, 48 can be formed entirely of a completely reacted titanium nitride film. A high quality, completely reacted titanium nitride film will not oxidize as readily and will adhere to the subsequently formed iridium oxide local interconnect 52. In this case the conductive layer 46, 48 is deposited to a thickness of between 200 and 1500 Angstroms.

Figure 8:
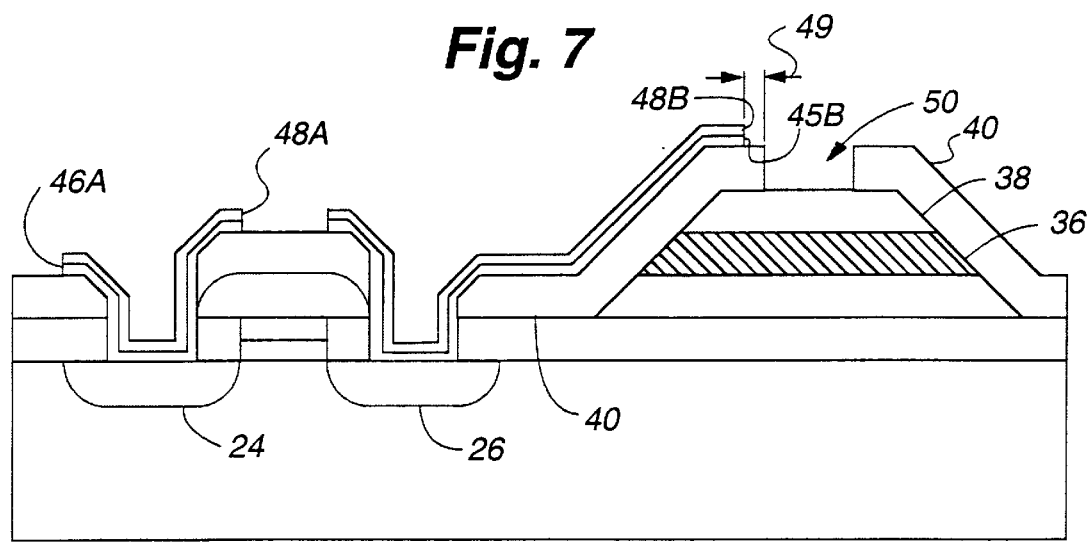

In FIG. 8 an electrode contact 50 is opened through the second oxide layer 40 to provide access to the upper electrode 38 of ferroelectric capacitor 37. The electrode contact 50 can be opened using a conventional oxide etch process. Note in FIG. 8 that the conductive layer portion 46B, 48B laterally extends only proximate to the upper electrode contact 50. The conductive layer portion 46B, 48B neither makes physical or electrical contact with electrode contact 50. A predetermined lateral spacing 49 exists so that the local dissociation of the water molecules in the second oxide layer 40 is confined to an area of the memory cell that will not degrade the electrical characteristics of ferroelectric dielectric layer 36. A spacing 49 of at least one-half micron is deemed to be sufficient to isolate the dissociation mechanism. A spacing of between about one-half micron to three microns is desirable. While the dissociation of the water molecules continues at the titanium nitride/oxide interface, little or no liberated hydrogen can diffuse to the ferroelectric dielectric layer 36. Thus, the degradation of ferroelectric memory cell electrical performance can be prevented.

It should be noted that while a one-half micron spacing is desirable and recommended, the actual contact between the termination of the conductive layer 46B and the upper electrode contact can be reduced to as little as one-tenth (0.1) of a micron before degradation of electrical performance increases measurably. In the preferred embodiment, the second oxide layer 40 itself is between 2000 and 3000 Angstroms thick. Therefore, conductive layer 46B could traverse partially down the sidewall of second oxide layer 40 so that an absolute minimum spacing of 0.1 micron could be achieved.

At this point in the process flow, an optional rejuvenation anneal can be performed in an oxygen ambient environment. A rapid thermal anneal can be performed at a temperature above 550° C. without causing significant degradation to the electrical performance of the ferroelectric capacitor and memory cell. However, it is recommended that the rejuvenation anneal be delayed until after the iridium oxide interconnect 52, described below, is completed.

Figure 9:
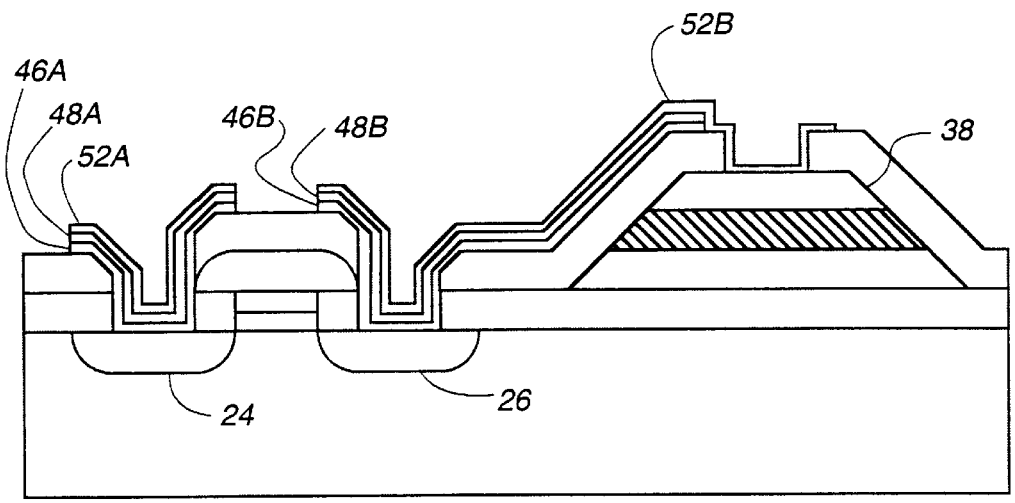

In FIG. 9, an iridium oxide local interconnect layer 52 is formed on the upper surface of conductive layer 46, 48. Iridium oxide local interconnect portion 52B extends from metalized source/drain contact 44 to the electrode contact 50 of ferroelectric capacitor 37. Iridium oxide local interconnect portion 52A continues the metalization of previously metalized source/drain contact 24 for subsequent connection to word line 14 (word line 14 is not shown in FIG. 9). The iridium oxide local interconnect layer 52 is patterned and etched to form the separate local interconnect portions 52A and 52B. Iridium oxide film is preferably etched using a reactive ion etch or ion milling process. The thickness of the deposited iridium oxide layer 52 is between about 500 and 2000 Angstroms.

Figure 10:
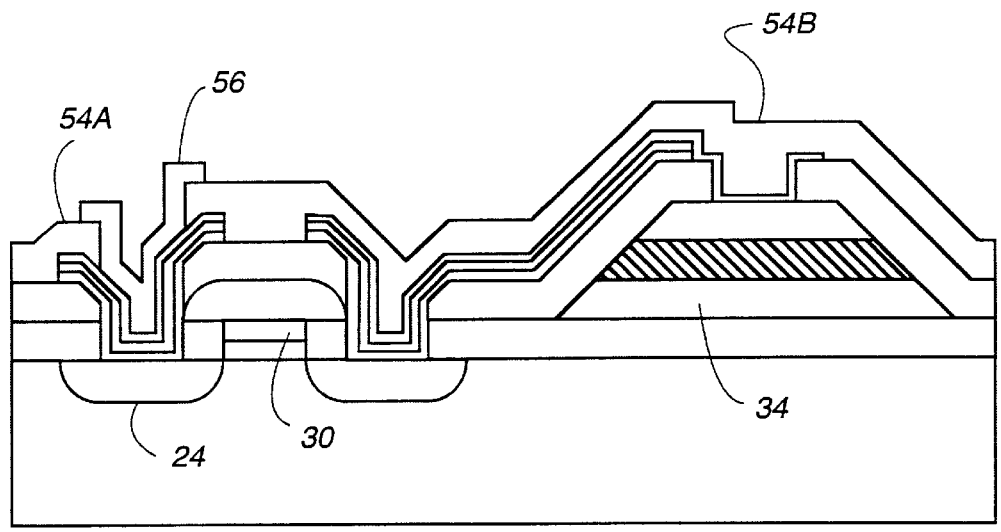

In FIG. 10, a third oxide layer 54 is deposited on the upper surface of the ferroelectric memory cell. The third oxide layer 54 is ideally phosphorous-doped PSG glass deposited to a thickness of between 3000 and 4000 Angstroms. The third oxide layer 54 is patterned and etched using a conventional oxide etching method. Finally, previously metalized source/drain contact 42 is further metalized with an aluminum/titanium nitride metalization 56 that forms the bit line 12 for the ferroelectric memory cell. The aluminum layer in metalization 56 is preferably about 8000 Angstroms thick and the titanium nitride layer in metalization 56 is preferably between 800 and 1500 Angstroms thick.

The word line 14 for the ferroelectric memory cell is the gate 30, which extends orthogonally to the plane of FIG. 10. The plate line 16 for the ferroelectric memory cell is bottom electrode 34, which also extends orthogonally to the plane of FIG. 10.

Once the third oxide layer 54 has been deposited, but before the oxide layer 54 is patterned and the bit line contact metalized, the ferroelectric memory cell is ideally annealed so that the Perovskite structure of the ferroelectric dielectric layer 36 is fully restored and maximum switched charge can be obtained. The annealing step is conducted in an oxygen ambient environment at about 550° C. for about two hours. Temperatures in excess of 550° C. can be used for the anneal at correspondingly shorter anneal times.

It has been shown that a local interconnect for a ferroelectric memory cell includes a conductive layer that extends from the source/drain contact of the ferroelectric cell transistor proximate to the electrode contact of the ferroelectric capacitor, and an iridium oxide local interconnect formed on the upper surface of the conductive layer extending from the source/drain contact of the transistor to the electrode contact of the ferroelectric capacitor. The lateral spacing between the termination of the conductive layer and the electrode contact is between one-half and three microns, so that ferroelectric degradation due to water molecule dissociation to form hydrogen can be minimized. Further, the ferroelectric memory cell fabricated according to the present invention can withstand elevated temperatures found in subsequent process annealing steps and in CERDIP packaging steps without a noticeable degradation in ferroelectric performance. Since the conductive layer extends underneath the local interconnect from the source/drain contact to close proximity with the upper electrode contact of the ferroelectric capacitor, low resistivity is also maintained.

Having described and illustrated the principles of the invention in a preferred embodiment thereof, it is appreciated by those having skill in the art that the invention can be modified in arrangement and detail without departing from such principles. For example, the exact thicknesses of the various layers described and the exact composition of the conductive layer can be changed as required. In particular it is known in the art that other elements form conductive oxides such as ruthenium, osmium, and rhodium, which can be substituted for iridium and their oxides substituted for iridium oxide. The contours of the various layers and the exact manner of terminating the conductive layer can be changed as required for differing process or design requirements. I therefore claim all modifications and variation coming within the spirit and scope of the following claims.

I claim:

1. An iridium oxide local interconnect method for a ferroelectric memory cell including a transistor and a ferroelectric capacitor, the method comprising the steps of:

(a) forming a conductive layer that extends from a source/drain contact of the transistor proximate to, but not making contact with, an electrode contact of the ferroelectric capacitor; and (b) forming an iridium oxide local interconnect on an upper surface of the conductive layer, the iridium oxide local interconnect extending from the source/drain contact of the transistor to the electrode contact of the ferroelectric capacitor.

2. The method of claim 1 further comprising the step of laterally terminating an end of the conductive layer not less than one-half micron from the electrode contact of the ferroelectric capacitor.

3. The method of claim 1 in which the step of forming the conductive layer comprises the step of forming a conductive layer having a titanium nitride bottom layer and an iridium top layer.

4. The method of claim 1 in which the step of forming the conductive layer comprises the step of forming a titanium nitride conductive layer.

5. The method of claim 1 further comprising the step of depositing an oxide layer on an upper surface of the ferroelectric memory cell and annealing the ferroelectric memory cell after forming the iridium oxide local interconnect.

6. The method of claim 5 in which the annealing step comprises the step of annealing the ferroelectric memory cell in an oxygen ambient environment at about 550° C. for about two hours.

7. An iridium oxide local interconnect method for a ferroelectric memory cell including a transistor and a ferroelectric capacitor, the method comprising the steps of:

(a) forming a transistor having a source/drain region;

(b) forming a first oxide layer over the transistor;

(c) forming a ferroelectric capacitor on an upper surface of the first oxide layer proximate to the transistor;

(d) forming a second oxide layer over an upper surface of the first oxide layer and the ferroelectric capacitor;

(e) opening a source/drain contact through the first and second oxide layers to the source/drain region of the transistor;

(f) forming a conductive layer that extends from the source/drain contact of the transistor proximate to, but not making contact with, the ferroelectric capacitor, said conductive layer forming a first local interconnect;

(g) opening an electrode contact through the second oxide layer to an upper electrode of the ferroelectric capacitor; and (h) forming an iridium oxide local interconnect on an upper surface of the first local interconnect, the iridium oxide local interconnect extending from the source/drain contact to the electrode contact of the ferroelectric capacitor.

8. The method of claim 7 further comprising the step of laterally terminating an end of the conductive layer not less than one-half micron from the electrode contact of the ferroelectric capacitor.

9. The method of claim 7 further comprising the step of depositing a third oxide layer on an upper surface of the ferroelectric memory cell.

10. The method of claim 9 further comprising the step of annealing the ferroelectric memory cell.

11. The method of claim 10 in which the annealing step comprises the step of annealing the ferroelectric memory cell in an oxygen ambient environment at about 550° C. for about two hours.

12. A conductive oxide local interconnect method for a ferroelectric memory cell including a transistor and a ferroelectric capacitor, the method comprising the steps of:

(a) forming a conductive layer that extends from a source/drain contact of the transistor proximate to, but not making contact with, an electrode contact of the ferroelectric capacitor; and (b) forming a conductive oxide local interconnect on an upper surface of the conductive layer, the conductive oxide local interconnect extending from the source/drain contact of the transistor to the electrode contact of the ferroelectric capacitor.

* * * * *